United States Patent [19]

Onodera et al.

[11] Patent Number: 4,752,735
[45] Date of Patent: Jun. 21, 1988

[54] METHOD FOR MEASURING THE TIME DEPENDENCE OF THE FIELD GRADIENT IN AN NMR IMAGING DEVICE

[75] Inventors: Takashi Onodera; Shigeru Matsui, both of Koganei; Hideki Kohno, Tokyo, all of Japan

[73] Assignee: Hitachi, Ltd., Tokyo, Japan

[21] Appl. No.: 946,957

[22] Filed: Dec. 29, 1986

[30] Foreign Application Priority Data

Dec. 27, 1985 [JP] Japan .................................. 60-292617

[51] Int. Cl.$^4$ ............................................. G01R 33/20
[52] U.S. Cl. ..................................... 324/309; 324/312
[58] Field of Search ............... 324/300, 307, 309, 312, 324/320

[56] References Cited

U.S. PATENT DOCUMENTS 4,644,276 2/1987 Sierocuk et al. ..................... 324/300
4,654,595 3/1987 Sepponen ............................ 324/309

OTHER PUBLICATIONS

Sekihara et al., "A New Method of Measuring Static Field Distribution Using Modified Fourier NMR Imaging", J. Phys. E.: Sci. Instruments, vol. 18, pp. 224–227, 1985.
Mansfield et al., "Biological and Medical Imaging by NMR", J. Magn. Res., 29, 355–373, 1978.
Frahm et al., "Signal Restoration . . . Gradients", J. Phys. E: Sci. Instrum., vol. 17, pp. 612–616, 1984.
Tropper, "Image Reconstruction . . . Acquisition", J. Magn. Res., 42, 193–202, 1981.
Feiner et al., "On NMR . . . Modulation", Appl. Phys., 22, 257–271, 1980.

Primary Examiner—Stewart J. Levy
Assistant Examiner—Kevin D. O'Shea
Attorney, Agent, or Firm—Antonelli, Terry & Wands

[57] ABSTRACT

Method for measuring the time dependence of an oscillating field gradient and representatively its integral function with respect to time for imaging method using the field gradient such as rapid chemical shift imaging method echo planar method, etc. A uniform specimen is placed within a coil of an NMR device, in which nuclear spins are excited; a phase encoding field gradient is applied thereto; and signals are sampled under application of the field gradient to be measured. These steps are repeated and an integral function of the field gradient with respect to time is obtained by using the peak position in the series of data obtained by this repetition.

5 Claims, 3 Drawing Sheets

U.S. Patent   Jun. 21, 1988   Sheet 2 of 3   4,752,735
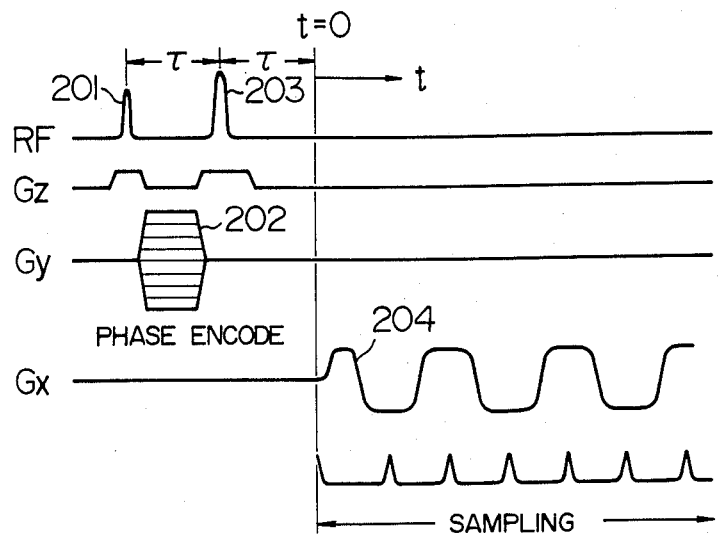
FIG. 2A (PRIOR ART) RF
FIG. 2B (PRIOR ART) Gz
FIG. 2C (PRIOR ART) Gy
FIG. 2D (PRIOR ART) Gx
FIG. 2E (PRIOR ART)
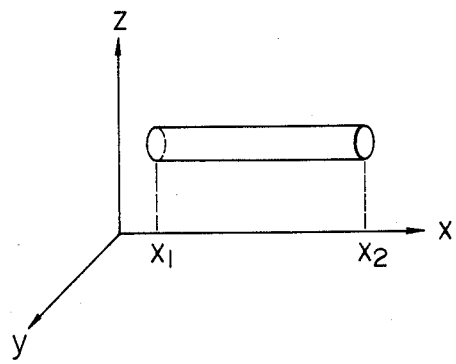
FIG. 3
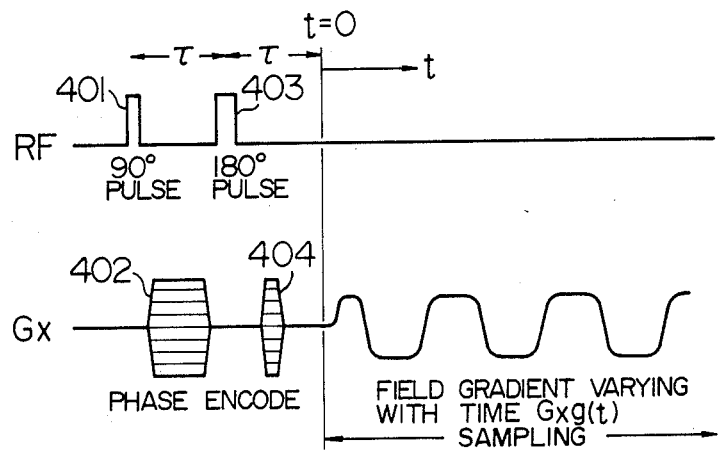
FIG. 4A RF
FIG. 4B Gx

| m \ n | 0 | 1 | ........... | (N−1) |
|---|---|---|---|---|
| $(\frac{M}{2}-1)$ | | | | |
| ⋮ | | | | |
| 0 | | | | |
| ⋮ | | | | |
| $(-\frac{M}{2})$ | | | | |

$M'(n\Delta t, mg_e t_e)$
$n = 0, 1, \ldots, (N-1)$
$m = (\frac{M}{2}-1), \ldots, 0, \ldots, (\frac{M}{2})$

METHOD FOR MEASURING THE TIME DEPENDENCE OF THE FIELD GRADIENT IN AN NMR IMAGING DEVICE

BACKGROUND OF THE INVENTION

This invention relates to a nuclear magnetic resonance (NMR) imaging device utilizing the periodical inversion of the field gradient and in particular to the time dependence of the field gradient.

In the NMR imaging generally a field gradient varying with time is utilized. In particular, by the echo-planar method (cf. Journal of Magnetic Resonance, 29, 355, 1978) or by the rapid chemical shift imaging method utilizing inverting magnetic field (U.S. patent application Ser. No. 750,475, field July 1, 1985, now U.S. Pat. No. 4,689,568, issued Aug. 25, 1987), signals are observed by applying a field gradient to a specimen while inverting it periodically. By these methods it is necessary to utilize a precise rectangular wave for the magnetic field. However, it is difficult to control precisely the waveform of the field gradient produced in practice, including characteristics of a field gradient generating system. Such imprecision in the control exerts undesirable influences on the image quality. In order to compensate this effect, a method, by which sampling is effected with unequal intervals (Journal of Physics, E17, 612, 1984), a method, by which data are sampled with an equal interval and then Fourier-transformed after having multiplied them by appropriate weight coefficients (cf. Journal of Magnetic Resonance, 42, 193, 1981), a method, by which an image is reconstructed by forming an appropriate linear sum of sampled data after having Fourier-transformed them (cf. Applied Physics, 22, 257, 1980), etc. have been proposed. By either of these methods it is necessary to know previously the waveform of the field gradient generated in practice.

As a method for obtaining this waveform, a method utilizing the ratio of the derivative $dF(t)/dt$ of the NMR signal $F(t)$ to $F(t)$ has been proposed. However this method had problems that requirements for the arrangement and the form of specimens were very severe, that it was sensitive to noises, because the derivative was used, etc.

SUMMARY OF THE INVENTION

An object of this invention is to provide a general method for measuring the time dependence of the field gradient used in an NMR imaging device in a form suitable to the reproduction of the image.

Another object of this invention is to provide a method permitting to obtain an integral of the field gradient with respect to time with a high precision.

This invention is characterized in that a uniform specimen having a single resonance is used, that a phase encoding field gradient having the same direction as that of the field gradient to be measured is applied thereto and that thereafter, under application of the field gradient to be measured, the NMR signal coming from the specimen is measured and an integral function of the field gradient with respect to time or its inverse function is obtained, starting from this NMR signal.

Stating more in detail, the specimen is located within a coil in the NMR imaging device;

The following steps are repeated, while varying the effective integral of the phase encoding field gradient with a constant interval, (a) exciting nuclear spins in the specimen, (b) applying a phase encoding field gradient having the same direction as that of the field gradient to be measured, and (c) sampling the NMR signal from the specimen, while applying the field gradient thereto;

the peak position in the row direction or in the line direction in a two-dimensional data matrix obtained by repeating them is detected; and the integral function of the field gradient with respect to time or its inverse function is obtained.

BRIEF DESCRIPTION OF THE DRAWINGS

FIGS. 2A–2E show a time chart illustrating an example of prior art imaging methods utilizing data obtained according to this invention for corrections;

FIG. 3 is a scheme illustrating a specimen used in an embodiment according to this invention;

FIGS. 4A and 4B show a time chart illustrating a measuring sequence for an embodiment according to this invention;

DESCRIPTION OF THE PREFERRED EMBODIMENTS

Figure 1:
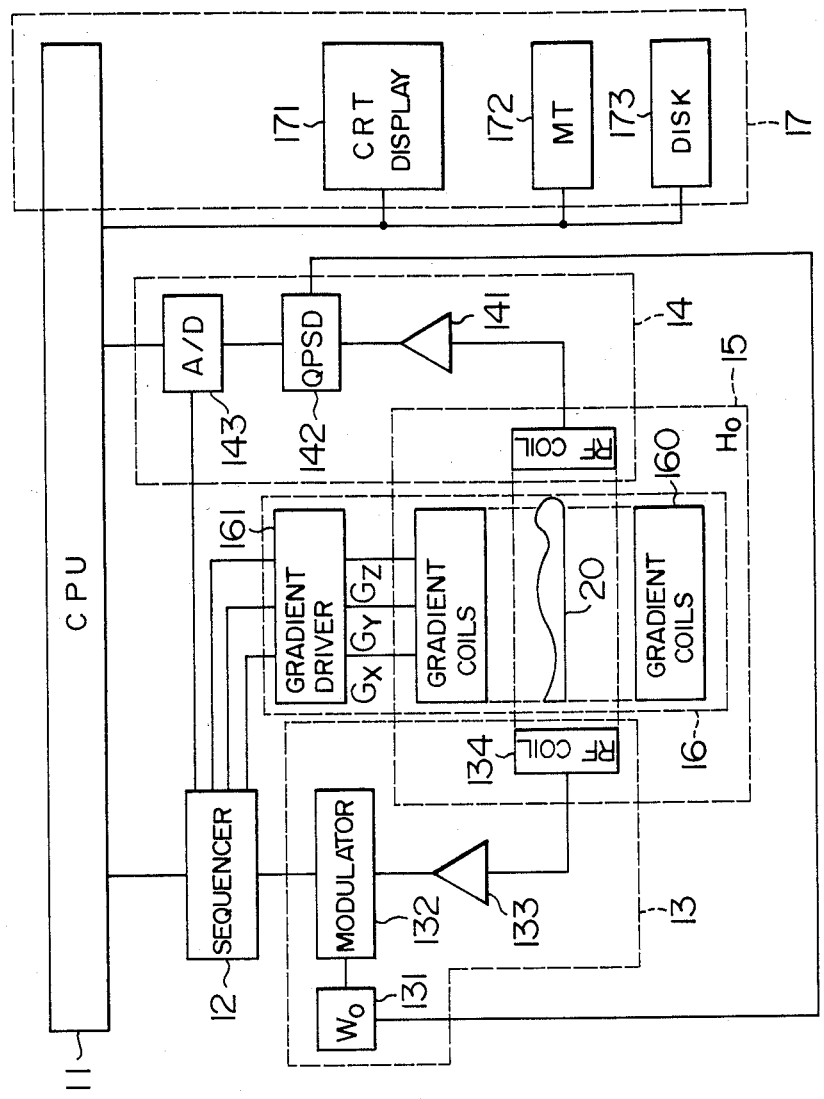
FIG. 1 is a block diagram illustrating an example of NMR imaging devices, to which this invention is applied.

Hereinbelow the construction of a representative device used for realizing this invention and its working mode will be explained. FIG. 1 is a block diagram illustrating the device, which consists of a sequencer 12 working under control of a CPU 11, a transmitting group 13, a receiving group 14, a field gradient generating group 16, a signal processing group 17 and a magnet 15 for producing a static magnetic field. The sequencer 12 sends various instructions necessary for the method according to this invention to the different groups described above. The transmitting group 13 comprises an RF synthesizer 131, a modulator 132 and an RF amplifier 133 and an RF magnetic field ($H_1$) is applied to an object to be studied, when RF pulses amplitude modulated according to one of the instructions are supplied to RF coils. The field gradient generating group 16 consists of field gradient coils 160 wound for the 3 directions of x, y and z and drivers 161 for the respective coils, and applies field gradients $G_x$, $G_y$ and $G_z$ to the object to be studied 20 in the 3 directions stated above according to one of the instructions of the sequencer 12. The response to the application of these field gradients is received by the receiving group 14 through the coils 134 described above. The receiving group 14 comprises an amplifier 141, a quadrature-phase sensitive detector 142 and an A/D converter 143. Two series of data quadrature-sampled are sent to the signal processing group 17 with a timing determined by one of the instructions from the sequencer 12. The signal processing group 17 effects processings such as Fourier-transformation, correction coefficient calculation, image reconstruction, etc. and forms an image starting from a distribution obtained by performing suitable operations on the signal intensity distribution or a plurality of signals representing an arbitrary cross-section, which image is displayed e.g. on a CRT display 171. A magnetic tape device 172 and a magnetic disk device 173 are used for recording programs and data necessary for these processings.

As an example of the imaging method using such an NMR imaging device there is known imaging of a spin density distribution distinguished by chemical shift. FIGS. 2A-2E show the measuring sequence thereof.

The object to be studied 20 is located in a static magnetic field. A 90° RF pulse indicated by 201 in FIG. 2A is applied thereto within a period of time, during which a constant z-direction field gradient $G_z$ indicated in FIG. 2B is applied. In this way nuclear spins in a slice perpendicular to the z-direction are excited. Then a phase encoding y-direction field gradient $G_y$ indicated by 202 in FIG. 2C is applied thereto. After that, the constant z-direction field gradient $G_z$ is again applied thereto and a 180° RF pulse indicated by 203 in FIG. 2A is applied thereto. Finally an x-direction field gradient, whose direction is inverted with time starting from a point of time $t=0$, is applied thereto and NMR signals are sampled with a constant sampling period $\Delta t$ during a certain period of time. The NMR signals are transformed into a series of spin echos indicated in FIG. 2E by the application of such a $G_x$. A two-dimensional Fourier-transformation is performed on measured data of this series of spin echos by using the number of echos and the sampling number attached to each of echos as variables.

The measuring sequence described above is repeated several times, while varying the amplitude of $G_y$. When a plurality of series of data thus obtained are Fourier-transformed by using the number of repetitions as a variable, a two-dimensional spin density distribution image distinguished by chemical shift can be obtained. Such a chemical shift imaging has been already disclosed in U.S. Pat. No. 4,689,568.

In the case of the imaging method, by which the NMR signals are read-out under application of the inverted field gradient, such as the example of the imaging method described above, it is presupposed that the waveform of the field gradient is completely rectangular. However in a large scale device it is difficult to generate a field gradient having a completely rectangular waveform, which is inverted. On the other hand, if the waveform of the field gradient and in particular the integral function thereof with respect to time are known, data can be corrected by using them so that a complete imaging can be performed.

Therefore, in this embodiment, before the imaging of the object to be studied using a field gradient as described above, the waveform of the field gradient used for this imaging and in particular the integral function thereof with respect to time are measured by using a specimen, which is uniform and has a single resonance.

In the case where the waveform of the field gradient in the x direction by the imaging method indicated in FIGS. 2A-2E is to be considered, and as the specimen to be studied, a specimen having a sufficient length in the x direction is used as indicated in FIG. 3. For example for the imaging of the hydrogen nucleus, a pipe having a uniform diameter filled with water can be used.

FIGS. 4A and 4B show a pulse sequence for the waveform measurement of the field gradient. At first, the specimen stated above is located in the static magnetic field of the NMR imaging device and nuclear spins in them are excited by a 90° RF pulses indicated by 401 in FIG. 4A. Then, after the lapse of $\tau$, a 180° RF pulse indicated by 403 is applied. Further, starting from a point of time ($t=0$), where a period of time $\tau$ has further elapsed, the field gradient, which is completely the same as that used for the imaging and inverted with time, i.e. the field gradient $G_xg(t)$, whose waveform is to be measured, is applied. At the same time, during a predetermined period of time measured from the point of time $t=0$ the signals are sampled at N points with a sampling interval $\Delta t$. That is, the signals are sampled at points of time $t=n\Delta t$ ($n=0, 1, \ldots, (N-1)$). In addition, before the point of time $t=0$, phase encoding field gradient pulses 402 and 404 having the same direction as that of $G_xg(t)$ are applied before and after the 180° RF pulse 403, respectively. In order to eliminate influences of transients of the rise and the fall in the phase encoding field gradient pulses and to determine a precise phase encoding quantity, the amplitude that the phase encoding field gradient is applied in the form of 2 separated pulses is controlled.

The pulse sequence for measuring the waveform of the field gradient indicated in FIGS. 4A and 4B is repeated M times, while varying the effective integral value of the phase encoding field gradient, i.e. the difference between the integral value of the pulse 402 and that of the pulse 404 with a constant interval. More concretely speaking, when the unit variation quantity of the effective integral value of the phase encoding field gradient is represented by $g_e t_e$, the effective integral value of the phase encoding field gradient measured every time is represented by $mg_e t_e$, where $$m = \left(\frac{M}{2} - 1\right), \ldots, 1, 0, -1, \ldots, \left(-\frac{M}{2}\right).$$

Repeating the procedure described above, $N \times M$ sampled values of the NMR signals can be obtained, which are expressed by $$M(n\Delta t, mg_e t_e)$$

where $$n = 0, 1, \ldots, (N-1)$$

$$m = \left(\frac{M}{2} - 1\right), \ldots, 1, 0, -1 \ldots \left(-\frac{M}{2}\right).$$

Here, denoting the integral function with respect to time $G_xg(t)$ to be calculated by $f_G(t)$, i.e.

$$f_G(t) = \int_0^t G_xg(t')dt' \quad (1)$$

each of the sampled values $M(n\Delta t, mg_e t_e)$ can be expressed as follows:

$$M(n\Delta t, mg_e t_e) = \int_{x_1}^{x_2} \exp\{-i\gamma x(mg_e t_e)\} \cdot \exp\{-i\gamma x f_G(n\Delta t)\} \quad (2)$$

$$\exp\{-i\gamma \Delta H_o(x) \cdot n\Delta t\} \cdot E(n\Delta t) dx,$$

where $x_1$ and $x_2$ are the lower and the upper limit, respectively, of the distribution region of the specimen; $\gamma$ is the gyro-magnetic ratio of the nuclear spin; $\Delta H_o(x)$ is the magnitude of the inhomogeneity of the static magnetic field; and $E(n\Delta t)$ is the attenuation of signals of the transverse relaxation.

Carrying out a discrete inverse Fourier-transformation of Eq. (2) with respect to m, the following equation can be obtained:

$$\hat{M}(n\Delta t, k\Delta x) = \int_{x_1}^{x_2} h(x - k\Delta x) \cdot \exp\{-i\gamma x f_G(n\Delta t)\}. \quad (3)$$

$$\exp\{-i\gamma \Delta H_o(x) \cdot n\Delta t\} \cdot E(n\Delta t) dx$$

where $$-M/2 \leq k < M/2$$

$$\Delta x \equiv \frac{1}{(\gamma/2\pi)Mg_e t_e}$$

$$h(x - k\Delta x) \approx \frac{1}{\pi} \text{sinc}\left(\frac{\pi(x - k\Delta x)}{\Delta x}\right)$$

and $h(x-k\Delta x)$ is a function having an extent of the order of $\Delta x$. In the integral represented by Eq. (3), in the case where the inhomogeneity of the static magnetic field is sufficiently small in the domain of the extent of $h(x-k\Delta x)$, since it can be supposed that $$\exp\{-i\gamma\Delta H_o(x)\cdot n\Delta t\} \approx \exp\{-i\gamma\Delta H_o(k\Delta x)\cdot n\Delta t\} \quad (4),$$

Eq. (3) can be written approximately as follows:

$$\hat{M}(n\Delta t, k\Delta x) \approx \exp\{-i\gamma\Delta H_o(k\Delta x) \cdot n\Delta t\} \cdot E(n\Delta t) \quad (5)$$

$$\int_{x_1}^{x_2} h(x - k\Delta x)\exp\{-i\gamma x f_G(n\Delta t)\}dx.$$

Here, if the magnitude of the inhomogeneity of the static magnetic field $\Delta H_o(k\Delta x)$ is known e.g. by another measurement, it is possible to eliminate the effect of the inhomogeneity of the static magnetic field by multiplying Eq. (5) by $\exp\{i\gamma\Delta H_o(k\Delta x)\cdot n\Delta t$. Further, carrying out a discrete inverse Fourier-transformation thereof with respect to k, as an expression corresponding to Eq. (1), the following equation is obtained:

$$M'(n\Delta t, mg_e t_e) = \int_{x_1}^{x_2} \exp\{-i\gamma x(mg_e t_e)\}\exp\{-i\gamma x g_G(n\Delta t)\}. \quad (7)$$

$$E(n\Delta t)dx$$

Carrying out the integralation and forming its absolute value, it is understood that $$|M'(n\Delta t, mg_e t_e)| = \quad (8)$$

$$(x_2 - x_1) \left| \text{sinc} \frac{x_2 - x_1}{2} \cdot \gamma\{mg_e t_e + f_G(n\Delta t)\} \right|$$

is valid.

From Eq. (8) it can be seen that, concerning a series of M×N data $M'(n\Delta t, mg_e t_e)$, the following 2 points can be enumerated;

(a) when it is thought that n is fixed, $M'(n\Delta t, mg_e t_e)$ is a sinc function with respect to $mg_e t_e$; and (b) where $$mg_e t_e + f_G(n\Delta t) = 0 \quad (9)$$

This function is maximum except for a phase factor.

Figures 5, 6:
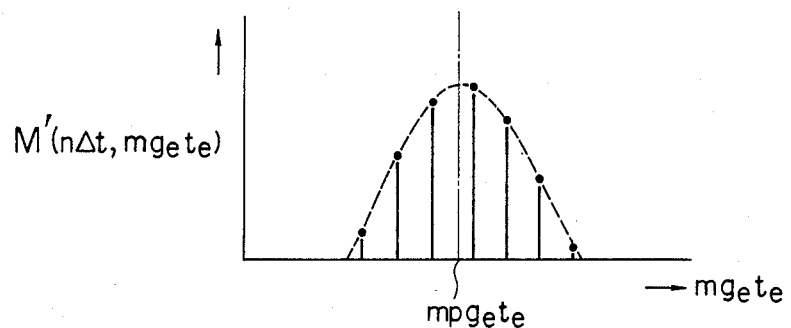
FIG. 5 is a scheme illustrating a data matrix obtained in the above embodiment.
FIG. 6 is a scheme illustrating the detection of the peak in the above embodiment.

Therefore, according to this embodiment, a matrix of N×M data $M'(n\Delta t, mg_e t_e)$ is formed, as indicated in FIG. 5. This matrix of data is obtained by performing operations, i.e. an inverse Fourier-transformation, elimination of errors in phase due to the inhomogeneity of the static magnetic field (multiplication by $\exp\{i\gamma\Delta H_o (k\Delta x)\cdot n\Delta t\}$ which has been previously obtained), and a Fourier-transformation, one after another on the series data $M(n\Delta t, mg_e t_e)$ obtained by the pulse sequence indicated in FIGS. 4A and 4B. In the case where the static magnetic field is sufficiently uniform, these operations may be omitted, i.e. the matrix of data M' $(n\Delta t, mg_e t_e)$ shown in FIG. 5 can be obtained directly by using the pulse sequence indicated in FIGS. 4A and 4B.

Now, the position $mpg_e t_e$, where $M'(n\Delta t, mg_e t_e)$ has a peak for each n, i.e. for each row of the matrix indicated in FIG. 5, will be calculated. However, since the values are obtained only in the form of dispersed data with an interval $g_e t_e$, as indicated in FIG. 6, the value of $mpg_e t_e$ is calculated by using the first order moment. Then, since from Eq. (9)

$$f_G(n\Delta t) = -mpg_e t_e \quad (10)$$

is valid, when the value of $mpg_e t_e$ is calculated for each row of FIG. 5, the integral function of $G_x g(t)$ with respect to time $f_G(n\Delta t)$ (n=0, 1, ... (N−1)) is obtained.

As explained above, according to the embodiments described by referring to FIGS. 3–6, the integral function of the waveform of the field gradient $G_x g(t)$ produced in an NMR imaging device with respect to time can be obtained with a high precision. The integral function with respect to time $F_G(n\Delta t)$ thus obtained is recorded in a magnetic disk device 173 indicated in FIG. 1 and used for correction of data, when effecting imaging of the object to be studied. In one example of correction methods sampled data are multiplied by weight coefficients $\exp\{-i\gamma(k\Delta x)\cdot f_G(n\Delta t)\}$ while applying a field gradient $G_x g(t)$, as indicated in FIG. 2, and after that the imaging processings described previously such as Fourier-transformation, etc. are effected.

Data of a practical embodiment are shown below. It is supposed that the sampling interval $\Delta t$ is 78 μs; the number of sampling points N is 1024; the variation unit of the effective integral value of the encoding field gradient gate is $5.30 \times 10^{-6}$ G·sec/mm; and the measurement is repeated 64 times, while varying m. That is, the measurement is repeated, while varying $mg_e t_e$ from $-1.696 \times 10^{-5}$ G·sec/mm to $1.643 \times 10^{-5}$ G·sec/mm and a data matrix $M(n\Delta t, mg_e t_e)$, which is a two-dimensional complex array having a size of 1024×64, can be obtained. Using these data, the data matrix $M'(n\Delta t, mg_e t_e)$ is also a two-dimensional complex array having a size of 1024×64. In order to ameliorate the peak detection precision, the data of 64 points for each line are increased to 128 points by interpolating them and after that the peak position $mpg_e t_e$ is determined by calculating the first order moment of the waveform. $f_G(n\Delta t)$ obtained in this way becomes an array of 1024 complex data.

Further, in the embodiment described above, the peak position in the row direction (m direction) of the data matrix indicated in FIG. 5 was detected. On the other hand, when the peak position in the line direction (n direction) is detected, it is possible to obtain the time interval necessary for varying the integral value of the field gradient $G_xg(t)$ by the unit variation quantity $g_e t_e$, i.e. the inverse function $F_G^{-1}(mg_e t_e)$ of the integral function of $G_xg(t)$ with respect to time. This inverse function $F_G^{-1}(mg_e t_e)$ is stored in a disk, which can be used as data for eliminating influences of the waveform of the field gradient at the imaging of the object to be studied. For example, in the case where the inhomogeneous interval sampling is used for the measurement of the object to be studied, data of $F_G^{-1}(mg_e t_e)$ are used as values determining the sampling timing.

We claim:

1. Method for measuring the time dependence of a field gradient in a predetermined direction produced on an almost homogeneous static magnetic field in an NMR imaging device, using a uniform specimen having a single resonance, comprising the steps of:
   (a) exciting nuclear spins in said specimen located within a coil in said NMR imaging device;
   (b) applying a phase encoding field gradient in the same direction as that of said field gradient whose time dependence is to be meassured;
   (c) measuring NMR signals coming from said specimen, while applying said field gradient whose time dependence is to be measured thereto;
   (d) repeating the steps of (a), (b) and (c), while varying the effective integral value of said phase encoding field gradient;
   (e) detecting the peak position of the data for a data matrix obtained by said repetition of the measurement of the NMR signals; and
   (f) obtaining an integral function of said field gradient whose time dependence is to be measured with respect to time or its inverse function, starting from said peak position.

2. Method according to claim 1, in which said specimen has a sufficient length along said predetermined direction.

3. Method according to claim 1, further comprising a step of applying a 180° RF pulse between said steps (a) and (b).

4. Method according to claim 3, in which said phase encoding field gradient is formed by a first pulse before said 180° RF pulse and a second pulse after said 180° RF pulse.

5. Method according to claim 1, further comprising a step for eliminating phase errors due to inhomogeneity of said static magnetic field contained in the data obtained by said repetition of the measurement of the NMR signals, whereby the peak position of the data is detected for a data matrix, for which the phase error have been eliminated.

* * * * *